US010502805B2

(12) United States Patent
Kartäusch et al.

(10) Patent No.: US 10,502,805 B2
(45) Date of Patent: Dec. 10, 2019

(54) PROCESSING MOVEMENT SIGNALS DURING A MAGNETIC RESONANCE SCAN

(71) Applicants: Ralf Kartäusch, Erlangen (DE); Uvo Hölscher, Erlangen (DE)

(72) Inventors: Ralf Kartäusch, Erlangen (DE); Uvo Hölscher, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 102 days.

(21) Appl. No.: 15/819,067

(22) Filed: Nov. 21, 2017

(65) Prior Publication Data
US 2018/0149724 A1 May 31, 2018

(30) Foreign Application Priority Data
Nov. 30, 2016 (DE) .................. 10 2016 223 809

(51) Int. Cl.
G01R 33/567 (2006.01)

(52) U.S. Cl.
CPC ...... G01R 33/5673 (2013.01); G01R 33/5676 (2013.01)

(58) Field of Classification Search
CPC ............ G01R 33/5673; G01R 33/5676; G01R 33/567; G01R 33/56
(Continued)

(56) References Cited

U.S. PATENT DOCUMENTS 6,501,979 B1 * 12/2002 Manning ................ A61B 5/055
600/413

9,414,767 B2 8/2016 Speier
(Continued)

FOREIGN PATENT DOCUMENTS

DE 102011007574 B4 12/2012
DE 102014210471 A1 12/2015
(Continued)

OTHER PUBLICATIONS

Dou, Jiangang, et al. "Cardiac diffusion MRI without motion effects." Magnetic Resonance in Medicine: An Official Journal of the International Society for Magnetic Resonance in Medicine 48.1 (2002): 105-114. (Year: 2002).*
(Continued)

Primary Examiner — Christopher P McAndrew
(74) Attorney, Agent, or Firm — Lempia Summerfield Katz LLC

(57) ABSTRACT

The disclosure relates to a method for processing movement signals detected during a magnetic resonance scan of a patient, and to a corresponding magnetic resonance device and a computer program product. According to the method, RF pulses are generated by a RF transmitting unit of a magnetic resonance device in order to excite nuclear spins in the body of the patient. Magnetic resonance signals are generated by the excited nuclear spins. For spatial encoding of the magnetic resonance signals, gradient pulses are generated by a gradient coil unit of the magnetic resonance device. The magnetic resonance signals are detected by a RF receiving unit of the magnetic resonance device. Furthermore, movement signals of the patient are detected by a movement detection unit during detection of the magnetic resonance signals, and these are processed by a processing unit.

13 Claims, 4 Drawing Sheets

(58) Field of Classification Search
USPC .......................................................... 324/309
See application file for complete search history.

(56) References Cited

U.S. PATENT DOCUMENTS

| | | | | |
|---|---|---|---|---|
| 2003/0088174 A1* | 5/2003 | Sussman | G01R 33/56325 | 600/410 |
| 2010/0331673 A1* | 12/2010 | Maschke | A61B 5/411 | 600/431 |
| 2011/0101978 A1* | 5/2011 | Lake | G01R 33/56509 | 324/309 |
| 2011/0175609 A1* | 7/2011 | Hu | G01R 33/3415 | 324/309 |
| 2012/0206140 A1* | 8/2012 | Banerjee | G01R 33/5611 | 324/309 |
| 2012/0262172 A1* | 10/2012 | Holmes | G01R 33/5602 | 324/309 |
| 2012/0268124 A1* | 10/2012 | Herbst | G01R 33/56509 | 324/309 |
| 2013/0278263 A1* | 10/2013 | Huang | G01R 33/5611 | 324/309 |
| 2014/0055135 A1* | 2/2014 | Nielsen | G01R 33/58 | 324/309 |
| 2014/0070807 A1* | 3/2014 | Biber | G01R 33/48 | 324/309 |
| 2014/0077811 A1* | 3/2014 | Lin | A61B 5/055 | 324/309 |
| 2014/0097839 A1* | 4/2014 | Son | G01R 33/56509 | 324/309 |
| 2015/0309146 A1* | 10/2015 | Jin | G01R 33/56509 | 324/309 |
| 2015/0346307 A1* | 12/2015 | Beck | G01R 33/34092 | 324/309 |
| 2016/0063738 A1* | 3/2016 | Saito | G01R 33/56316 | 382/131 |
| 2016/0069976 A1* | 3/2016 | Kickhefel | G01R 33/4828 | 324/309 |
| 2016/0077180 A1 | 3/2016 | Beck | | |
| 2016/0091591 A1* | 3/2016 | Grodzki | G01R 33/56509 | 324/309 |
| 2016/0313433 A1 | 10/2016 | Beck | | |

FOREIGN PATENT DOCUMENTS

| | | |
|---|---|---|
| DE | 102014218653 A1 | 3/2016 |
| DE | 102015207590 A1 | 10/2016 |

OTHER PUBLICATIONS

German Office Action for related German Application No. 10 2016 223 809.4 dated Jul. 28, 2017.

Kartäusch R. et. al. "Process Motion State", Siemens AG, Sep. 12, 2016.

* cited by examiner

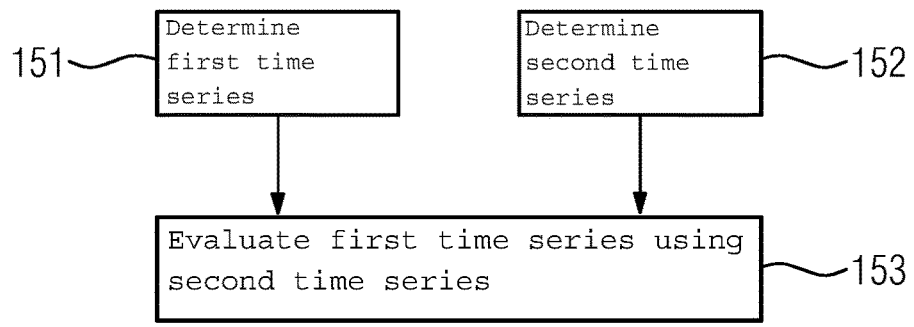
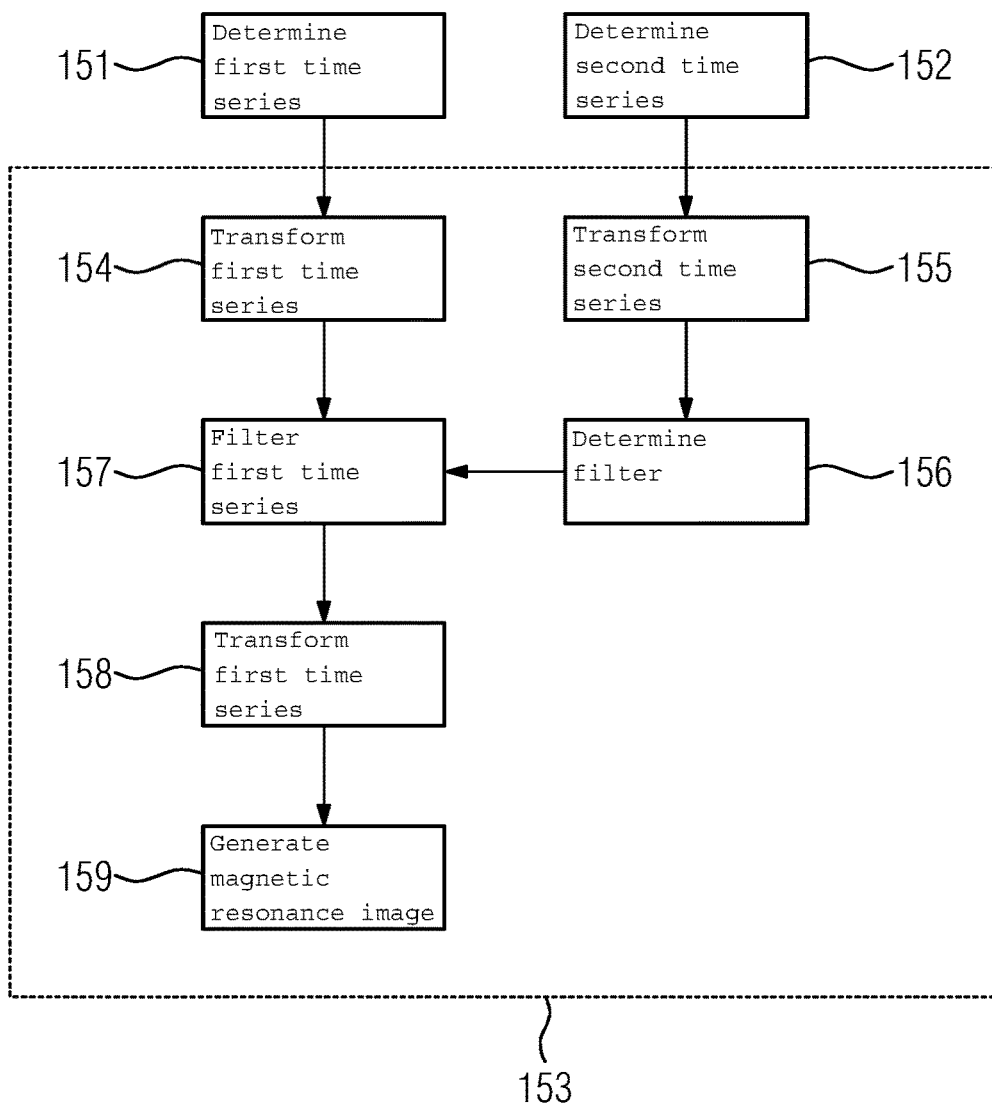

PROCESSING MOVEMENT SIGNALS DURING A MAGNETIC RESONANCE SCAN

The application claims the benefit of German Patent Application No. DE 10 2016 223 809.4, filed Nov. 30, 2016, which is hereby incorporated by reference in its entirety.

TECHNICAL FIELD

The disclosure relates to a method for processing movement signals which are detected during a magnetic resonance scan of a patient, and to a corresponding magnetic resonance device and to a computer program product.

BACKGROUND

Magnetic Resonance Imaging (MRI) is a known technique for generating magnetic resonance images of the inside of the body of a patient, which is based on the physical phenomenon of magnetic resonance (MR). A movement of the patient during a magnetic resonance scan may impair the quality of the magnetic resonance images. Therefore, attempts are conventionally made to avoid recording magnetic resonance signals during the movement and/or to bring about periods with restricted movement, for example by way of breath holding. A further possible approach includes, as disclosed, for example, in German Patent Publication Nos. DE 102014210471 A1 or DE 102015207590 A1, in carrying out a movement correction or movement compensation.

The movement of the patient may be detected in different ways, for example, by navigators, a respiratory belt, an ECG measuring device, and/or further movement sensors. For example, U.S. Pat. No. 9,414,767 discloses a method for correction by an ECG signal during the magnetic resonance scan.

SUMMARY AND DESCRIPTION

The disclosure is based on the object of processing the movement signals detected by one or more movement sensor(s) more effectively in order to achieve greater use.

The scope of the present disclosure is defined solely by the appended claims and is not affected to any degree by the statements within this description. The present embodiments may obviate one or more of the drawbacks or limitations in the related art.

Accordingly, a method is proposed for processing movement signals detected during a magnetic resonance scan of a patient. Radio frequency (RF) pulses are generated by a RF transmitting unit of a magnetic resonance device in order to excite nuclear spins in the body of the patient. As a rule, excitation occurs by way of magnetization of the nuclear spins. Magnetic resonance signals are generated by the excited nuclear spins. For spatial encoding of the magnetic resonance signals, gradient pulses are generated by a gradient coil unit of the magnetic resonance device. The magnetic resonance signals are detected by a RF receiving unit of the magnetic resonance device. Furthermore, during detection of the magnetic resonance signals, movement signals of the patient are detected by an, in particular, external and/or independent, movement detection unit, which are processed by a processing unit. Processing of the movement signals which are detected by a movement detection unit enables new applications, whereby the magnetic resonance scan may be improved.

Movement signals that characterize a movement of the patient may be detected by the movement detection unit. The movement signals may be detected not just during detection of the magnetic resonance signals but also during generation of the magnetic resonance signals, in other words in particular during excitation of the nuclear spins and/or waiting times for a relaxation of the nuclear spins. The movement signals may be detected continuously during the magnetic resonance scan of the patient.

The movement signals are advantageously detected independently of detection of the magnetic resonance signals. Detection of the movement signals may not require any preparation of the patient. A movement of the chest of the patient, in particular, a respiration movement and/or a heartbeat of the patient, may be detected by the movement signals.

During detection of the respiratory movement, the processing unit may determine a respiration curve from the movement signals, which shows, in particular, whether the patient breathes in or out at a particular instant. Furthermore, it is conceivable for a cardiac movement to be derived from the movement signals, so that an electrocardiography (ECG)-like curve may be provided.

For example, the movement detection unit includes at least one camera, which may be directed toward the patient, and/or a RF coil. The RF coil may be arranged, for example, under the chest of the patient and detect the movement signals using a change in loading of the RF coil. A movement detection unit of this kind does not require any preparation of the patient.

The movement detection unit may also include other sensors, such as, for example, a respiratory belt or an ECG measuring device, even if preparation of the patient is necessary here. Image-based detection of the movement signals, for instance by a navigator, is also conceivable, even if, as a rule, it requires additional scanning time and potentially has lower sensitivity.

The RF transmitting unit may include a body coil, which is permanently installed in a magnetic resonance device. It is also conceivable for the RF transmitting unit to include one or more local coil(s) which may be arranged directly on the body of the patient. Furthermore, it is possible for the body coil and/or the one or more local coil(s) to be able to also receive magnetic resonance signals. In other words, the RF receiving unit may include the body coil and/or one or more local coils. The RF transmitting unit and the RF receiving unit may therefore also include shared components.

The RF pulses may be generated and/or the magnetic resonance signals detected and/or the gradient pulses generated by taking into account the movement signals. The magnetic resonance scan may therefore be matched more effectively to the movement of the patient.

In particular, generation of the RF pulses and/or detection of the magnetic resonance signals and/or generation of the gradient pulses may be synchronized with the movement of the patient. Therefore, operation of the gradient coil unit and/or RF transmitting unit and/or RF receiving unit may be synchronized.

In particular cases, in which the movement of the patient is of particular interest, the movement signals may be used in order to separate magnetic resonance signals, which originate from moving nuclear spins, from magnetic resonance signals, which originate from static nuclear spins. Synchronization may advantageously be used here. More precisely, the carrier of the nuclear spin, namely the nucleus, which has the nuclear spin, conventionally moves in the case of a moving nuclear spin. Analogously, the nucleus which has the static nuclear spin is conventionally static in the case of a static nuclear spin.

Synchronization using the movement signals may be carried out with all elements of a magnetic resonance sequence, which may be based on properties of the gradient pulses, RF pulses, RF receiving unit, and/or a reconstruction of magnetic resonance images.

Synchronization of this kind may include a, (e.g., periodic), change in an amplitude and/or duration of the gradient pulses, which is generated by the gradient coil unit. Synchronization of this kind may include a, (e.g., periodic), change in amplitude and/or phase and/or frequency of the RF pulses generated by the RF transmitting unit. Furthermore, synchronization of this kind may include a, (e.g., periodic), change in a frequency and/or phase and/or bandwidth of the receiving properties of the RF receiving unit.

One embodiment of the method provides that phases of the RF pulses and RF receiving unit are synchronized using the movement signals in such a way that the relative phase between the RF pulses and the RF receiving unit, (e.g., an analog-to-digital converter (ADC) of the RF receiving unit), is constant for moving nuclear spins in successive scan cycles. Here, a scan cycle may refer to the period between two successive RF pulses for excitation of nuclear spins in the body of the patient by way of a RF transmitting unit.

This method may also be understood as a modified variant of what is known as RF spoiling. With RF spoiling, the phases of the RF pulses of the RF receiving unit are conventionally changed from excitation to excitation, (e.g., between two successive scan cycles), while the relative phase from excitation and receipt of the magnetic resonance signals is kept constant. As a result, signal components that still originate from preceding scan cycles, (e.g., which have not yet decayed from one excitation to the next), may be suppressed.

Synchronization with the movement of the patient indicates that the relative phase between successive excitations is constant only for moving nuclear spins, while for nuclear spins that do not move, (e.g., are static), the relative phase has large variations. Consequently, the magnetic resonance signals of the moving nuclear spins add up in phase and therefore make a greater contribution to the resulting magnetic resonance imaging, while the magnetic resonance signals of the static nuclear spins are greatly suppressed.

A further embodiment of the method provides that the gradient pulses include at least one bipolar gradient pulse, wherein an amplitude and/or duration and/or a direction of the at least one bipolar gradient pulse is synchronized using the movement signals, in other words the timing, amplitude and/or direction of the at least one bipolar gradient pulse occurs as a function of the movement signals. The gradient moment may therefore be suppressed for static nuclear spins.

As a rule, bipolar gradient pulses are characterized in that their zeroth gradient moment is equal to zero and their first gradient moment is not equal to zero. Gradient pulses of this kind may cause a resulting gradient moment of the moving nuclear spins, but no resulting gradient moment of the static nuclear spins. If the amplitude and/or the duration and/or the direction of these gradient pulses is/are advantageously synchronized with the movement of the patient, a magnetic resonance sequence may be used which applies variable gradient moments to moving nuclear spins, but no gradient moments to static nuclear spins.

Synchronization of the at least one bipolar gradient pulse using the movement signals may be used for phase-encoding magnetic resonance signals of moving nuclear spins to generate, in particular, magnetic resonance images of parts of the body of the patient with non-static nuclear spins.

Synchronization may be used for phase-encoding non-linear, (e.g., periodic), moving nuclear spins. If synchronization were omitted, (such as, for example with conventional flux imaging, in particular a conventional phase contrast angiography), moving nuclear spins would also be phase-encoded, but the severity of the effect would be random. As a result of synchronization, the effect may be purposefully used and the artifacts that otherwise result may be avoided. For example, all periodically moving nuclear spins may be encoded with an identical phase during a scan. All periodically moving nuclear spins may be encoded with a predefined variable phase over the course of a scan.

So that the impressed gradient moments are independent of the movement during a periodic movement, a high amplitude may be used in the case of a low speed of movement, in particular at turning points of the periodic movement, or a small amplitude of the at least one bipolar gradient pulse may be used in the case of a high speed of movement.

In order to impress particular temporal sequences of different gradient moments, the gradient moments that are independent of the movement may accordingly be scaled over time, for example a linearly increasing course.

A further embodiment of the method provides that a first time series is determined using the magnetic resonance signals and a second time series is determined using the movement signals. The first time series is evaluated using the second time series. This allows, in particular, improved evaluation of dynamic magnetic resonance scans.

In particular, it is proposed that the first and the second time series are each transformed from a time range into a frequency range, for example, by a Fourier transform. Using the second time series transformed into the frequency range, a filter is advantageously determined, using which the first time series transformed into the frequency range is filtered. Using the second time series transformed into the frequency range, at least one frequency band may be determined, and this is used for determining the filter. The filtered first time series may be transformed back from the frequency range into the time range, for example, by an inverse Fourier transform. The data filtered in this way enables improved evaluation of the magnetic resonance data.

If, for example, the magnetic resonance scan includes a plurality of repetitions, the time series of the magnetic resonance signals, hereinafter also called image data, may be transformed by a Fourier transform from a time range into a frequency range. The transformed image data may have a high signal component at low frequencies, in particular around frequency equal to zero, which conventionally originates from the static nuclear spins. In addition, the transformed image data may have further signal components at higher frequencies and these represent the moving nuclear spins.

From the movement signals a further time series may be derived, in particular a time-dependent movement curve, which is hereinafter also called movement data, and this may similarly be transformed by Fourier transform from the time range into the frequency range. From the transformed movement data frequency bands may be derived which may result from respiratory movements, (e.g., approx. 0.5 Hz), and/or heartbeats, (e.g., 1.5 Hz), of the patient. Using this information, a filter may be created in the frequency range, and this may be applied to the transformed image data. For example, all image data which is located outside of the one or more frequency band(s) may be filtered out. Following an inverse Fourier transform of the filtered image data in the period, the back-transformed image data represents nuclear spins which may be associated with a specific movement, in particular the respiratory and/or cardiac movement.

Using the first time series, successive magnetic resonance images may be generated, wherein at least one region of the plurality of magnetic resonance images is determined in which a correlation of the second time series with the first time series is defined. The determined at least one region may in particular be masked and/or marked.

A correlation threshold value may be defined for this. Furthermore, using the first time series and the second time series a correlation value may be determined, with a correlation being found when the correlation threshold value is exceeded by the correlation value. The second time series of the movement signals may include a movement curve of a body part of the patient, in particular the chest and/or heart and/or finger, as is shown in the following example of a functional magnetic resonance scan.

At least one region of the brain is advantageously determined whose magnetic resonance images have an alternating contrast, with the frequency of the contrast alternation correlating with the frequency of the activity and rest phases. The correlation may be found by determining the frequency band of the periodic movement. This frequency band may then be excluded from the evaluation. An upward and downward movement of the head owing to the respiratory movement of the patient may thereby be prevented from adversely affecting the scan results.

Previous methods, in which a respiratory movement is corrected by an analysis of the magnetic resonance images solely with the aid of image-based movement detection, may suffer from the fact that the image-based movement detection is not sufficiently reliable. This problem may be solved by the method proposed here because the movement detection may be performed by the movement detection unit with a higher time resolution and/or a higher signal-to-noise ratio. In particular, the respiration and heartbeat of the patient may be more reliably resolved thereby.

According to a further example, one embodiment of the proposed method may be used to localize, in particular small, regions which are primarily affected by movement, but not by brain activity. These regions may be arteries whose contrast is affected by the blood flow which is driven by the heartbeat. At least one region may be determined in which the temporal contrast behavior correlates strongly with the frequency and/or amplitude of the movement curve. This region may be masked and/or marked as unsuitable.

A further embodiment of the method provides that the movement signals are supplied to a movement model, wherein the magnetic resonance signals are reconstructed using the movement model. A movement model may link a movement of at least two regions of the body of the patient, (e.g., a chest movement and/or cardiac movement), with a movement of an internal organ. The movement of at least one of these at least two regions may be detected with the aid of the movement detection unit.

Some organs in the body of the patient pulsate owing to the blood flow. This movement cannot conventionally be identified by image-based movement detection because, as a rule, this is very localized. If, in particular, a movement of a particular organ may be predicted, for example, if it is known that, on average, the liver moves down and up by 1 mm due to the respiratory movement, this information may be used in a reconstruction which uses a movement model of this kind. The movement signals, in particular a timing and/or an amplitude of the movement, may then be used as input variables for the movement model with which the magnetic resonance signals may be corrected during reconstruction.

Furthermore, it is proposed that a reaction of the patient to a contrast agent is observed using the movement signals. A lot of magnetic resonance scans include the administration of a contrast agent. Administration may occur in the magnetic resonance device during the course of the magnetic resonance scan. Contrast agents may sometimes cause side effects, such as, for example, allergic reactions or panic attacks, in the patient.

A reaction of the patient to the contrast agent may advantageously be observed by way of the respiratory behavior and/or the heart rate, which may be determined using the movement signals. This information may be displayed for an operator of the magnetic resonance device and/or be used to detect unusual patient reactions. An evaluation of the movement signals may also be used to prompt the operator to check the condition of the patient. In particular, if the patient is not capable of communicating, (e.g., dementia patients), it may be very advantageous to assess the condition of the patient during administration of a contrast agent.

Furthermore, it is proposed that a condition of the patient, in particular during an interventional procedure, is observed using the movement signals.

Interventional procedures may be assisted by a magnetic resonance scan. The movement signals may be used as an indicator of the medical condition of the patient. Furthermore, they may be used during planning and/or performance of an interventional procedure.

Many patients experience discomfort before and/or during a magnetic resonance scan. Therefore, the health of the patient in the magnetic resonance device may change during a magnetic resonance scan. For example, a shortened respiratory cycle and/or a quickened heartrate may be a sign of discomfort in the patient, so an interruption in the magnetic resonance scan is recommended. Such changes may be detected with the aid of the movement detection unit and be displayed for the operator.

Furthermore, the movement detection unit may also be used for detection of the patient per se. While magnetic resonance devices may be used to examine patients, sometimes phantoms or other non-living objects are also examined. Strict safety regulations are usually adhered to if patients, (e.g., human patients), are being scanned. This may relate, for example, to a specific absorption rate (SAR) and/or magnetic field changes (dB/dt). For scientific studies, in particular, it may be useful to bypass limitations of this kind. The movement signals may be used to determine whether a living and therefore, as a rule, moving patient is in the magnetic resonance device. If this is the case, bypassing of the limitations may be prevented.

Furthermore, a magnetic resonance device is proposed, wherein the MR device includes a RF transmitting unit, a RF receiving unit, a gradient coil unit, a movement detection unit and a processing unit. The magnetic resonance device is designed to carry out a method for processing movement signals which are detected during a magnetic resonance scan of a patient.

The advantages of the magnetic resonance device match the advantages of the method stated above in detail. Features, advantages or alternative embodiments mentioned in this connection may similarly be transferred to the other claimed subject matters and vice versa.

The movement detection unit may include a movement sensor, for example in the form of one or more camera(s) and/or a RF coil, which is designed to detect movement signals using a change in the loading of the RF coil.

The RF transmitting unit may include at least one RF transmit coil and the RF receiving unit may include at least one RF receive coil. It is also conceivable for the RF transmitting unit and the RF receive coil to include at least one combined RF transmit and receive coil which may transmit RF pulses as well as receive magnetic resonance signals.

The processing unit may include an arithmetic unit, (e.g., at least one processor), and/or a storage device for storing programs and/or data.

In addition, a computer program product is proposed that includes a program and may be loaded directly into a storage device of a programmable arithmetic unit of a processing unit of a magnetic resonance device and has program functions, (e.g., libraries and auxiliary functions), in order to a method for processing movement signals, which are detected during a magnetic resonance scan of a patient, when the computer program product is run in the processing unit. The computer program product may include software having a source code, which still has to be compiled and linked or which just has to be interpreted, or an executable software code which just has to be loaded into an appropriate arithmetic unit for execution. The method may be carried out robustly and in a way that may be repeated in an identical manner by the computer program product. The computer program product is configured in such a way that it may carry out the method by the processing unit. The processing unit has the requirements in each case, such as, for example, an appropriate working memory or an appropriate logic unit, so that the respective method acts may be carried out efficiently.

BRIEF DESCRIPTION OF THE DRAWINGS

Further advantages, features and details of the disclosure emerge from the exemplary embodiments described below as well as with reference to the drawings. Mutually corresponding parts are provided with identical reference numerals in all figures, in which:

FIG. 5-7 depict block diagrams of possible method acts.

DETAILED DESCRIPTION

Figure 1:
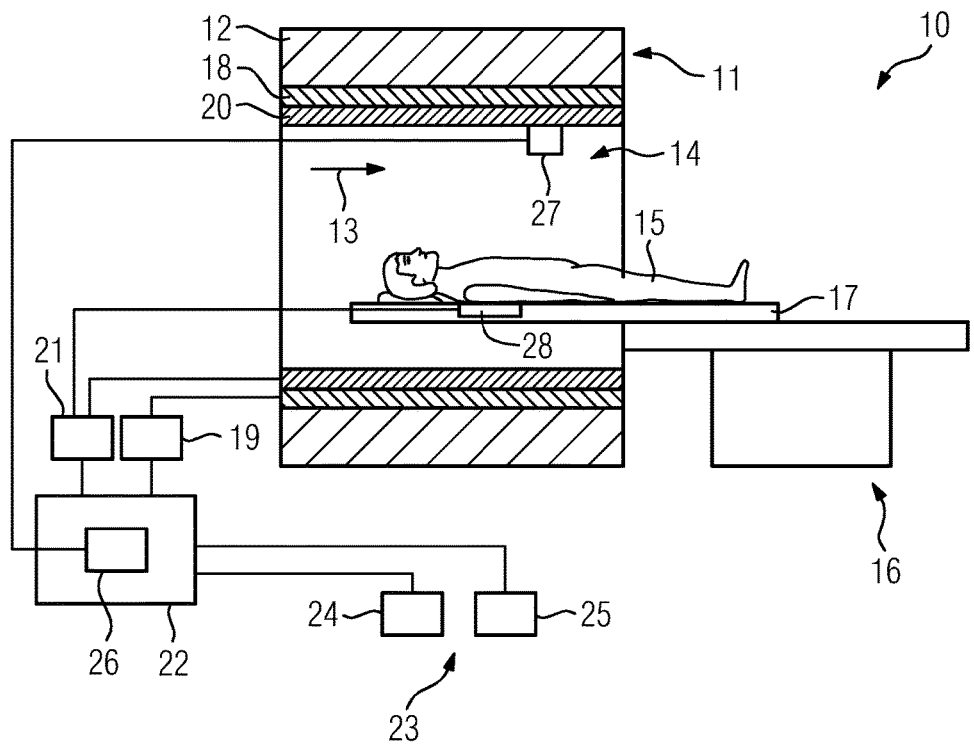
FIG. 1 depicts an exemplary magnetic resonance device in a schematic diagram.

FIG. 1 schematically depicts a magnetic resonance device 10. The magnetic resonance device 10 includes a magnetic unit 11 having a main magnet 12 for generating a strong and, in particular, time-constant main magnetic field 13. Furthermore, the magnetic resonance device 10 includes a patient recording region 14 for recording a patient 15. In the present exemplary embodiment, the patient recording region 14 is cylindrical and cylindrically surrounded in a circumferential direction by the magnetic unit 11. A design of the patient recording region 14 that differs herefrom is also conceivable. The patient 15 may be pushed into the patient recording region 14 by a patient positioning device 16 of the magnetic resonance device 10. The patient positioning device 16 has for this purpose a patient couch 17 designed so it may move inside the patient recording region 14.

The magnetic unit 11 also has a gradient coil unit 18 for generating gradient pulses which are used for spatial encoding during a magnetic resonance scan. The gradient coil unit 18 is controlled by a gradient control unit 19 of the magnetic resonance device 10. The magnetic unit 11 also includes a RF transmitting unit 20, which in the present exemplary embodiment is designed as a body coil permanently integrated in the magnetic resonance device 10. The RF transmitting unit 20 is designed to transmit RF pulses and an excitation of nuclear spins resulting therefrom which is established in the main magnetic field 13 generated by the main magnet 12. The RF transmitting unit 20 is controlled by a radio frequency antenna control unit 21 of the magnetic resonance device 10. The RF pulses are irradiated into an examination space formed by a patient receiving region 14 of the magnetic resonance device 10. The RF transmitting unit 20 is also designed to receive magnetic resonance signals, so it simultaneously acts as part of a RF receiving unit. The RF receiving unit includes a RF coil 28, which may also be called a local coil because the RF coil is arranged close to the patient 15.

The magnetic resonance device 10 has a system control unit 22 for controlling the main magnet 12, the gradient control unit 19, and the radio frequency antenna control unit 21. The system control unit 22 centrally controls the magnetic resonance device 10, such as, for example, the execution of a predetermined imaging gradient echo sequence. The system control unit 22 includes, moreover, an evaluation unit (not shown) for evaluation of magnetic resonance signals which are acquired during the magnetic resonance scan. The magnetic resonance device 10 includes, moreover, a user interface 23 which is connected to the system control unit 22. Control information, such as, for example, imaging parameters, and reconstructed magnetic resonance images, may be displayed on a display unit 24, (e.g., on at least one monitor), of the user interface 23 for a medical operator. The user interface 23 has an input unit 25, by which the medical operator may input information and/or parameters during a scanning process.

The magnetic resonance device 10 also includes a movement detection unit for detecting movement signals of the patient during detection of the magnetic resonance signals. In this example, the movement detection unit includes a camera 27, with which optical movement signals may be detected. Movement signals may, however, also be detected, for example, by the RF coil 28, which is arranged under the chest of the patient, because the change over time in the loading state of the RF coil 28 allows conclusions to be drawn about the movement, in particular the respiratory movement, of the patient 15.

The system control unit 22 includes a processing unit 26 which is designed for processing movement signals. For this purpose, the processing unit may include an arithmetic unit, in particular at least one processor, and/or a storage device for storing programs and/or data.

A program may be loaded directly into the processing unit 26, program functions in order to carry out a method for processing movement signals, which are detected during a magnetic resonance scan of a patient when the program is run in the processing unit 26 of the magnetic resonance device 10.

Figure 2:
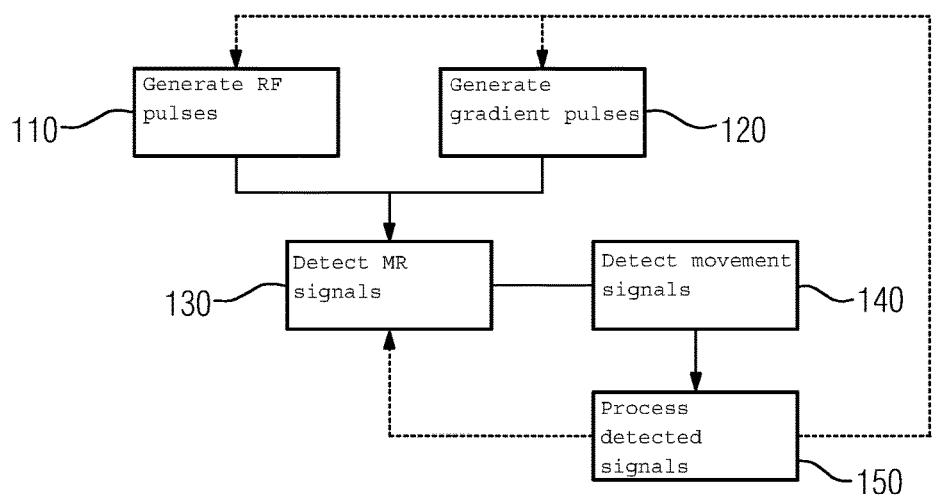
FIG. 2 depicts a block diagram of an exemplary method for processing movement signals during a magnetic resonance scan.

FIG. 2 illustrates an exemplary method for processing movement signals which are detected during a magnetic resonance scan of the patient 15. RF pulses for the excitation of nuclear spins in the body of the patient 15 are generated in 110 by a RF transmitting unit 20 and generation of magnetic resonance signals by way of the excited nuclear spins. Gradient pulses for spatial encoding of the magnetic resonance signals are generated by a gradient coil unit 18 in 120. The magnetic resonance signals are detected in 130 by a RF receiving unit. Meanwhile, movement signals of the patient are detected by a movement detection unit in 140, and these are processed in 150 by a processing unit.

The RF pulses may be generated and/or the magnetic resonance signals detected and/or the gradient pulses generated using the movement signals. This is shown in FIG. 2 by the broken lines.

As a result, detection of the magnetic resonance signals may be adjusted in such a way that only magnetic resonance signals of moving nuclear spins are effectively scanned. This may be used, in particular, to generate magnetic resonance images which show only flowing blood. Furthermore, for example, magnetic resonance signals of moving nuclear spins and magnetic resonance signals of static nuclear spins may be separated during reconstruction of the magnetic resonance images. Tissue, in particular which moves during breathing and/or the heartbeat, may be shown thereby.

Figure 3:
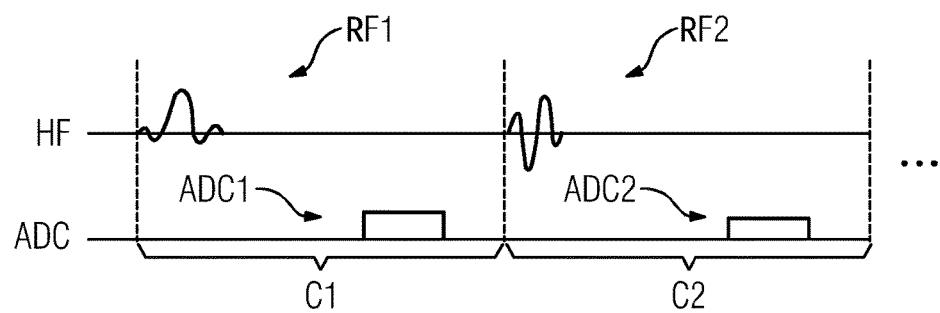
FIG. 3 depicts an exemplary detail of a magnetic resonance sequence including two successive scan cycles.

FIG. 3 advantageously illustrates an embodiment of the processing of the movement signals in 150, after which the phases of the RF pulses RF1, RF2 and the phases of the readout processes ADC1, ADC2 of the RF receiving unit are synchronized using the movement signals in such a way that the relative phase between the RF pulses RF1, RF2 and the readout processes ADC1, ADC2 of the RF receiving unit is constant for moving nuclear spins in successive scan cycles C1, C2. Here the RF pulses RF1, RF2 are plotted as a function of time on the axis RF and the readout processes ADC1, ADC2 of the RF receiving unit on the axis ADC.

We examine, by way of example, a moving first nuclear spin, which is located during scan cycle C1 at position $x_A$ and during scan cycle C2 at position $x_B$. In particular, the first nuclear spin may move periodically back and forth between the positions $x_A$ and $x_B$. By contrast, a static second nuclear spin is at position $x_A$.

The RF pulse RF1 of a first scan cycle C1 has a phase $\Phi_{RF1A}$ at position $x_A$ and a phase $\Phi_{RF1B}$ at position $x_B$. Analogously, the RF pulse RF2 of a second scan cycle C2 following the first scan cycle C1 has a phase $\Phi_{RF2A}$ for position $x_A$ and a phase $\Phi_{RF2B}$ for position $x_B$. Furthermore, the readout process ADC1 of the first scan cycle C1 has a phase $\Phi_{ACD1A}$ for position $x_A$ and a phase $\Phi_{ACD1B}$ for position $x_B$, and the readout process ADC2 of the second scan cycle C2 has a phase $\Phi_{ADC2A}$ for position $x_A$ and a phase $\Phi_{ADC2B}$ for position $x_B$.

The relative phase between the RF pulses RF1, RF2 and the readout processes ADC1, ADC2 of the RF receiving unit may refer to the difference in the location-dependent phases $\Phi_{RF1A}$ and $\Phi_{ADC1A}$ and $\Phi_{RF2A}$ and $\Phi_{ADC2A}$ and $\Phi_{RF1B}$ and $\Phi_{ADC1B}$ and $\Phi_{RF2B}$ and $\Phi_{ADC2B}$.

To record the moving first nuclear spin without suppression, $(\Phi_{RF1A}-\Phi_{ADC1A})=(\Phi_{RF2B}-\Phi_{ADC2B})$ advantageously applies, in other words the relative phase of the first nuclear spin remains constant during its movement from $x_A$ to $x_B$, so the magnetic resonance signals add up in phase.

In order to suppress the magnetic resonance signal of the static second nuclear spin as much as possible, $(\Phi_{RF1A}-\Phi_{ADC1A})\neq(\Phi_{RF2A}-\Phi_{ADC2A})$ advantageously applies, in other words the relative phase of the second nuclear spin changes, so that the static nuclear spins add up incoherently and are therefore wholly or partially eliminated.

Analogous conditions may also apply to further scan cycles. The course of the movement over time of the moving nuclear spins may be determined by processing the movement signals in 150. The repetition rate of the scan cycles and course over time, when a scan is performed and at which position, may thereby be adjusted such that these conditions may be met over the entire period of the magnetic resonance scan.

Figure 4:
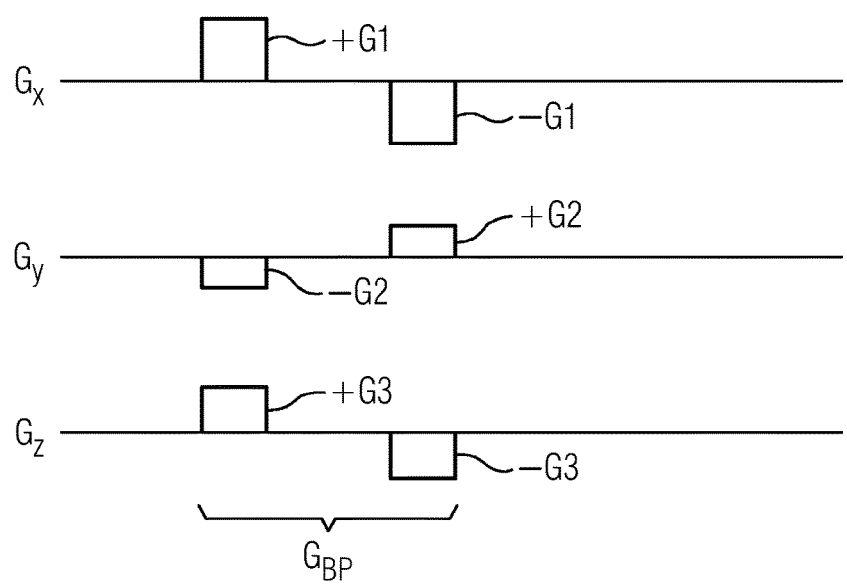
FIG. 4 depicts an exemplary detail of a magnetic resonance sequence including a bipolar gradient pulse.

In a further variant, the gradient pulses may include at least one bipolar gradient pulse, wherein in 150 an amplitude and/or a direction of the at least one bipolar gradient pulse is/are synchronized using the movement signals. FIG. 4 illustrates a bipolar gradient pulse $G_{BP}$ which shows an exemplary detail of a magnetic resonance sequence. A course over time of the bipolar gradient pulse $G_{BP}$ is illustrated on three gradient axes $G_x$, $G_y$, $G_z$, in other words the amplitudes of the gradient pulse $G_{BP}$ are shown on three gradient axes $G_x$, $G_y$, $G_z$ over time. The bipolar gradient pulse $G_{BP}$ includes two subpulses which each have one component on each of the gradient axes $G_x$, $G_y$, $G_z$. The first subpulse therefore includes the components +G1, −G2, and +G3 and the second subpulse the components −G1, +G2 and −G3. The values of the time integrals of the components on one gradient axis are equal in amount with an unequal sign, so the zeroth gradient moment of $G_{BP}$ is equal to zero. The direction of the gradient pulse $G_{BP}$ results from a vectorial overlaying of the components of the gradient pulse $G_{BP}$.

The generation of the bipolar gradient pulse $G_{BP}$, which is characterized, in particular, by its timing, an amplitude, and/or its direction, using the movement signals, indicates that variable gradient moments may be applied to moving nuclear spins, but gradient moments cannot be applied to static nuclear spins, and this may be used, in particular, for phase-encoding magnetic resonance signals of moving nuclear spins.

FIG. 5 illustrates that in 150 a first time series may be determined during processing of the movement signals by a processing unit 26 in 151 using the magnetic resonance signals. In 152 a second time series may be determined using the movement signals and in 153 the first time series may be evaluated using the second time series.

In particular, as shown in FIG. 6, the first time series may be transformed in 154 and the second time series in 155 from a time range into a frequency range. Using the second time series transformed into the frequency range, a filter may be determined in 156, using which the first time series transformed into the frequency range is filtered in 157.

As a result, movement may be filtered out of the signal dynamics. This may be used, in particular, to correct functional magnetic resonance data in respect of the respiratory movement.

Furthermore, it is possible for the first time series filtered in 157 to be transformed back from the frequency range into the time range in 158, in order, for example, to generate one or more magnetic resonance image(s) using the filtered and back-transformed first time series in 159.

Figure 7:
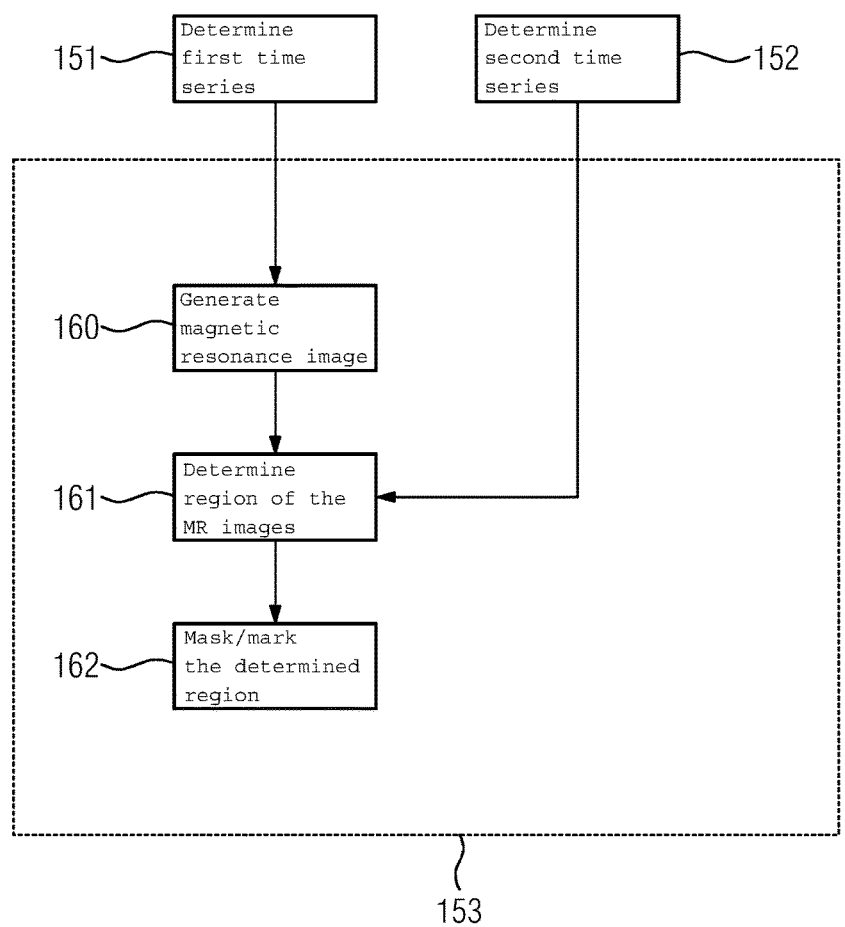

In particular, as shown in FIG. 7, magnetic resonance images may be generated in 160 using the first time series and in 161 at least one region of the plurality of magnetic resonance images may be determined in which a correlation of the second time series with the first time series is found. The determined at least one region may be masked and/or marked 162.

According to a further aspect, the movement signals may be supplied in 150 to a movement model, with the magnetic resonance signals being reconstructed using the movement model.

In particular, a localized movement may be detected. This may be used, in particular, to mark and/or filter pulsating vessels during a functional magnetic resonance scan and/or to correct magnetic resonance images by a movement model.

Reference is again made to the fact that the method described above in detail and the illustrated detection pattern-generating unit and magnetic resonance device are merely exemplary embodiments which a person skilled in the art may modify in a wide variety of ways without departing from the scope of the disclosure. Furthermore, use of the indefinite article "a" or "an" does not preclude the relevant features from also being present several times. Similarly, the term "unit" does not preclude the relevant components from including a plurality of cooperating sub-components which may optionally also be spatially distributed.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for processing movement signals detected during a magnetic resonance scan of a patient, the method comprising:
   generating, by a radio frequency (RF) transmitting unit, RF pulses for exciting nuclear spins in a body of the patient;
   generating magnetic resonance signals by the excited nuclear spins;
   generating, by a gradient coil unit, gradient pulses for spatial encoding of the magnetic resonance signals;
   detecting, by a RF receiving unit, the magnetic resonance signals;
   detecting, by a movement detection unit, movement signals of the patient during the detecting of the magnetic resonance signals;
   determining, by a processing unit, a first time series using the magnetic resonance signals;
   determining, by the processing unit, a second time series using the movement signals;
   transforming each of the first time series and the second time series from a time range into a frequency range;
   determining a filter using the transformed second time series; and
   filtering the transformed first time series using the determined filter.

2. The method of claim 1, wherein one or more of the RF pulses are generated, the magnetic resonance signals are detected, or the gradient pulses are generated by taking into account the movement signals.

3. The method of claim 2, further comprising:
   synchronizing phases of the RF pulses and the RF receiving unit using the movement signals such that a relative phase between the RF pulses and the RF receiving unit is constant for moving nuclear spins in successive scan cycles.

4. The method of claim 3, wherein the gradient pulses comprise at least one bipolar gradient pulse,
   wherein one or more of an amplitude, a duration, or a direction of the at least one bipolar gradient pulse is synchronized using the movement signals.

5. The method of claim 4, further comprising:
   supplying the movement signals to a movement model; and
   reconstructing the magnetic resonance signals using the movement model.

6. The method of claim 5, further comprising:
   observing a reaction of the patient to a contrast agent, observing a condition of the patient, carrying out a detection of a patient using the movement signals, or a combination thereof.

7. The method of claim 1, further comprising:
   synchronizing phases of the RF pulses and the RF receiving unit using the movement signals such that a relative phase between the RF pulses and the RF receiving unit is constant for moving nuclear spins in successive scan cycles.

8. The method of claim 1, wherein the gradient pulses comprise at least one bipolar gradient pulse,
   wherein one or more of an amplitude, a duration, or a direction of the at least one bipolar gradient pulse is synchronized using the movement signals.

9. The method of claim 1, further comprising:
   generating a plurality of magnetic resonance images using the first time series; and
   determining at least one region of the plurality of magnetic resonance images in which a correlation of the second time series of the movement signals with the first time series is defined.

10. The method of claim 1, further comprising:
    supplying the movement signals to a movement model; and
    reconstructing the magnetic resonance signals using the movement model.

11. The method of claim 1, further comprising:
    observing a reaction of the patient to a contrast agent, observing a condition of the patient, carrying out a detection of a patient using the movement signals, or a combination thereof.

12. A magnetic resonance device comprising:
    a radio frequency (RF) transmitting unit configured to generate RF pulses for exciting nuclear spins in a body of a patient and generate magnetic resonance signals by the excited nuclear spins;
    a gradient coil unit configured to generate gradient pulses for spatial encoding of the magnetic resonance signals;
    a RF receiving unit configured to detect the magnetic resonance signals;
    a movement detection unit configured to detect movement signals of the patient during the detecting of the magnetic resonance signals; and
    a processing unit configured to:
       determine a first time series using the magnetic resonance signals;
       determine a second time series using the movement signals;

transform each of the first time series and the second time series from a time range into a frequency range;

determine a filter using the transformed second time series; and filter the transformed first time series using the determined filter.

13. A magnetic resonance device comprising:

a processor; and a computer program product having a program, the computer program product configured to be loaded directly into a storage device of the processor of the magnetic resonance device, wherein the computer program product, with the processor, cause the magnetic resonance device to:

generate RF pulses for exciting nuclear spins in a body of a patient;

generate magnetic resonance signals by the excited nuclear spins;

generate gradient pulses for spatial encoding of the magnetic resonance signals;

detect the magnetic resonance signals;

detect movement signals of the patient during the detecting of the magnetic resonance signals;

determine a first time series using the magnetic resonance signals;

determine a second time series using the movement signals;

transform each of the first time series and the second time series from a time range into a frequency range;

determine a filter using the transformed second time series; and filter the transformed first time series using the determined filter.

* * * * *